United States Patent
Fujita et al.

[11] Patent Number: 5,126,614
[45] Date of Patent: Jun. 30, 1992

[54] PIEZOELECTRIC DEVICE AND RELATED CONVERTING DEVICES

[75] Inventors: Masanori Fujita; Shinichi Okamoto; Hirokazu Ono, all of Tokyo, Japan

[73] Assignee: Seikosha Co., Ltd., Tokyo, Japan

[21] Appl. No.: 580,051

[22] Filed: Sep. 10, 1990

Related U.S. Application Data

[62] Division of Ser. No. 400,612, Aug. 30, 1989, abandoned.

[30] Foreign Application Priority Data

Aug. 31, 1988 [JP] Japan ............... 63-217690

[51] Int. Cl.⁵ .................................. H01L 41/08
[52] U.S. Cl. ........................... 310/323; 310/311; 310/328; 310/363; 310/364
[58] Field of Search .......... 310/311, 320, 323, 328, 310/357, 358, 363, 364; 350/350 S

[56] References Cited

U.S. PATENT DOCUMENTS

| | | | |
|---|---|---|---|
| 4,394,069 | 7/1983 | Kaye | 350/347 E |
| 4,634,226 | 1/1987 | Isogai et al. | 350/350 S X |
| 4,634,228 | 1/1987 | Iwasaki et al. | 350/350 S X |
| 4,664,480 | 5/1987 | Geary et al. | 350/350 S X |
| 4,792,211 | 12/1988 | Harada et al. | 350/350 S X |
| 4,796,979 | 1/1989 | Tsuboyama | 350/350 S |
| 4,812,018 | 3/1989 | Kobayashi | 350/350 S X |
| 4,869,577 | 9/1989 | Masaki | 350/350 S |
| 4,875,378 | 10/1989 | Yamazaki et al. | 73/862.68 X |
| 4,878,150 | 10/1989 | Rounds | 361/311 |
| 4,879,059 | 11/1989 | Hanyu et al. | 350/350 S X |
| 4,882,207 | 11/1989 | Coates et al. | 350/340 X |
| 4,900,132 | 2/1990 | Bos | 350/350 S X |

Primary Examiner—Mark O. Budd
Attorney, Agent, or Firm—Jordan and Hamburg

[57] ABSTRACT

A piezoelectric device includes a first electrode, a second electrode disposed in opposing, spaced relation to the first electrode, a ferroelectric liquid crystal interposed between the first and second electrodes, a first alignment layer formed between the first electrode and the ferroelectric liquid crystal, and a second alignment layer formed between the second electrode and the ferroelectric liquid crystal.

6 Claims, 8 Drawing Sheets

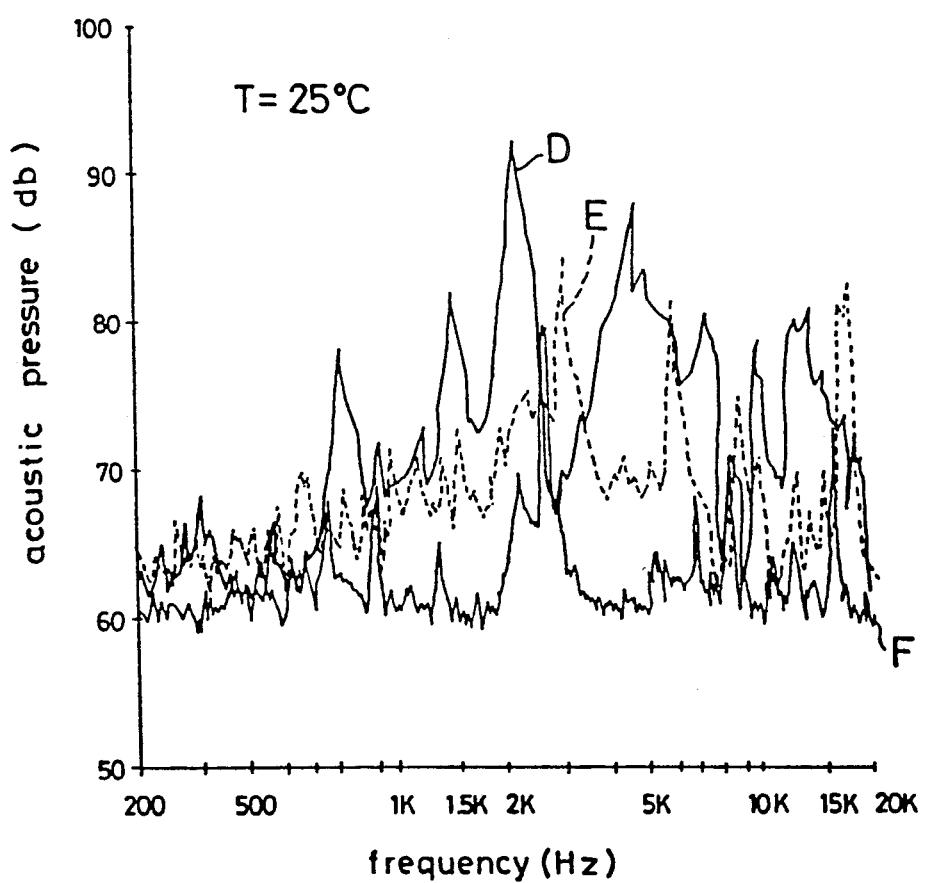
F I G. 3

PIEZOELECTRIC DEVICE AND RELATED CONVERTING DEVICES

This is a division, of application Ser. No. 400,612, filed Aug. 30, 1989, now abandoned.

BACKGROUND OF THE INVENTION

The present invention relates to a piezoelectric device for use with an electromechanical converting device or a mechanoelectric converting device.

Some well-known piezoelectric devices involve the use of ceramic materials such as PZT (a solid solution of lead titanate (PbTiO3) and lead zirconate (PbZrO3)) and polymeric materials such as PVDF (polyvinylidene fluoride). Those piezoelectric devices are widely utilized for electromechanical converting devices such as a sound emitting body for emitting sounds ranging from an audible region to an ultrasonic region, an actuator and a motor as well as for mechanoelectric converting devices such as a pressure sensor and the like.

In the case of a piezoelectric device using the ceramic materials, calcination has to be effected at high temperatures of 1000°~1500° C., with the result that it is difficult to obtain dimensional accuracy. The ceramic materials tend to be broken due to their fragility, and are thereby thinned with difficulty.

In the case of the piezoelectric device employing the polymeric materials, the polymeric material formed in a film-like shape is mechanically stretched, as a result of which it is difficult to obtain the dimensional accuracy and make it thin.

As described above, the conventional piezoelectric devices are formed in arbitrary configurations with difficulty because of a variety of constraints.

The prior art piezoelectric devices require a poling process (DC high electric field is applied at a Curie temperature or above, and a cooling process continues till the temperature comes to the Curie temperature or under, thus aligning the directions of electric dipoles) in order to develop the piezoelectric property. Therefore, the manufacturing processes become complicated.

Accordingly, it is a primary object of the present invention, to obviate the foregoing problems inherent in the prior art devices, and to provide an absolutely novel piezoelectric device and converting devices which utilize this piezoelectric device.

BRIEF DESCRIPTION OF THE DRAWINGS

FIGS. 2-6 are different experiment-based characteristic diagrams each showing one example of a piezoelectric property of the piezoelectric device;

DESCRIPTION OF THE PREFERRED EMBODIMENTS

An embodiment of the present invention will hereinafter be described with reference to FIG. 1.

(I) EMBODIMENTS THE PIEZOELECTRIC DEVICE

Figure 1:
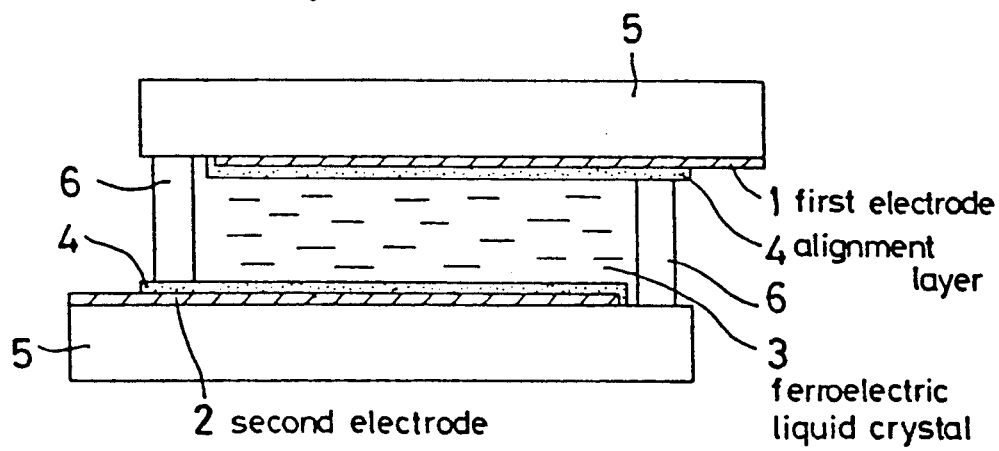
FIG. 1 is a sectional view illustrating one example of a piezoelectric device according to the present invention.

Turning first to FIG. 1, there is illustrated one embodiment of a piezoelectric device according to the present invention.

In FIG. 1, the numerals 1 and 2 represent first and second electrodes each having conductivity and composed of ITO (indium tin oxide), Al (aluminum), Cr (chrome) and Ni (nickel).

Designated at 3 is a ferroelectric liquid crystal interposed between the first electrode 1 and the second electrode 2.

Alignment layers generally indicated at 4 are formed between the first electrode 1 and the ferroelectric liquid crystal 3 and between the second electrode 2 and the ferroelectric liquid crystal 3.

Alignment layers 4 involve the use of organic materials such as polyimide, polyvinyl alcohol, polyamide, Teflon and acrylic resins, and also inorganic materials such as SiO2, Al2O3 and the like. Note that the alignment layers 4 may be formed between the first electrode 1 and the ferroelectric liquid crystal 3 and/or between the second electrode 2 and the ferroelectric liquid crystal 3.

The numeral 5 represents a support member formed of glass; and 6 a seal member for sealing the ferroelectric liquid crystal 3.

The first and/or second electrode 1 and 2 and the support member 5 may be used in common by employing a tabular member of, e.g., phosphor bronze.

It is to be noted that the ferroelectric liquid crystal 3 is not necessarily sealed by the seal member 6.

As discussed above, a fundamental component of the piezoelectric device of the invention is the ferroelectric liquid crystal 3 which is variable in shape, whereby arbitrary configurations can easily be provided when constituting the device. Manufacture of the device does not require the processes fundamentally at higher temperatures than several-hundred degrees, and hence the device can be formed with a high dimensional accuracy. It is also possible to obtain a device which is excellent in terms of mechanical strength.

There will be given measurement results obtained by evaluating the piezoelectric properties of the piezoelectric device on the basis of acoustic pressures at respective frequencies while varying parameters.

In respective measurement diagrams, the axis of the abscissa indicates frequencies of AC voltages impressed on the piezoelectric device, while the axis of ordinate the indicates acoustic pressures.

Note that the piezoelectric device depicted in FIG. 1 is used, and measuring conditions are as follows. Measuring method:

An AC voltage (a driving frequency is set at 200 Hz ~20 kHz) is applied between the first electrode 1 and the second electrode 2. An acoustic pressure (expressed in dB) is measured by means of a microphone in a position approximately 15 (mm) upwards away from the first or second electrode. From this measured value a magnitude of piezoelectric effect is judged.

Size of the device:
70 (mm)×80 (mm)
Material of the support member:
Glass (a thickness is 1.0 (mm))
Type of the ferroelectric liquid crystal 3:
ZLI-3774 (made by Merc Corp.)

MEASUREMENT EXAMPLE 1

The measurement is effected by changing the alignment process of alignment layers 4. The first and second electrodes 1 and 2 are spaced 8 ($\mu$m) away from each other.

A: Homogenous alignment process (polyimide films are spin-coated, and thereafter undergoes baking. These films are aligned by a rubbing method.)

B: Homeotropic alignment process (a silane coupling agent is coated by dipping and thereafter baking is carried out.)

C: No alignment process (the polyimide films are spin-coated and subsequently baking is performed thereon.)

Figure 2:
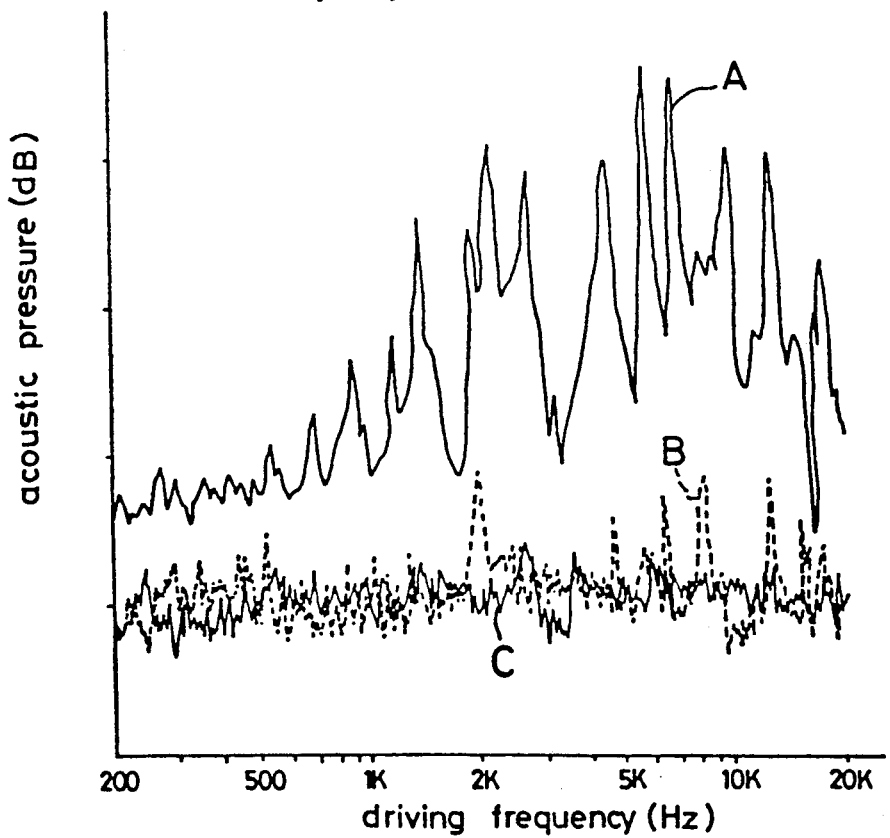

The above-mentioned measurement results are shown in FIG. 2.

Even the alignment layers 4 which have undergone a homeotropic alignment process (B) exhibit the piezoelectric effects. However, the alignment layers which have been subjected to a homogeneous alignment process (A) present remarkably intensive piezoelectric effects. This piezoelectric property is, it can be regarded, peculiar to a phase exhibiting a ferroelectric property because of a sharp decrease in the vicinity of a transition temperature from a phase exhibiting the ferroelectric property of the ferroelectric liquid crystal to a smectic phase A when increasing the temperature. In the measurement when effecting no alignment process (C), a piezoelectric effect is not apparent due to noise.

With the above-described arrangement, the effective piezoelectric property can be acquired on the basis of the homogeneous alignment process.

Measurement Example 2

The measurement is performed by varying the homogeneous alignment process of the alignment layers as follows. Note that the homogeneous alignment process is the same as (A) in the measurement example 1. The first electrode 1 and the second electrode 2 are spaced 10 ($\mu$m) away from each other.

D: The alignment layers 4 are in homogeneous alignment so that they are neither parallel nor anti-parallel with respect to one another. The angle of the alignment processing direction in this example is 100°.

E: The alignment layers 4 are in homogeneous alignment to be anti-parallel with respect to each other, that is the angle of alignment is 180°.

F: One of the alignment layers 4 in, homogeneous alignment while the other alignment layer 4 is not homogenously aligned.

The measurement results will be shown in FIG. 3.

As is obvious from FIG. 3, the magnitudes of the piezoelectric effects are ranked as follows: D>E>F. It can be considered that the piezoelectric effects when effecting the homogeneous alignment process on the alignment layers in parallel with each other is, although not shown in the Figure, equal to those when the alignment layers undergo the homogeneous alignment process not in parallel with each other.

As discussed above, where the alignment layers are subjected to the homogeneous alignment process in parallel or with a deviation not in parallel with each other large piezoelectric effects can be obtained.

Measurement Example 3

The measurement is carried out by changing the degree of the homogeneous alignment process of the alignment layers in the following manner. Note that the homogenous alignment process and the homeotropic alignment process are the same as those in (A) and (B) in the measurement example 1. A spacing at which the first and second electrodes 1 and 2 are disposed is 8 ($\mu$m).

G: Homogeneous alignment process (the number of rubbing operations is more than 10, and an angle of the alignment processing direction is set at 100°) based on the strong rubbing method.

H: Homogeneous alignment process (the number of rubbing operations is 2~3, and an angle of the alignment processing direction is set at 100°) based on a weak rubbing method.

I: Homeotropic alignment process.

Figure 4:
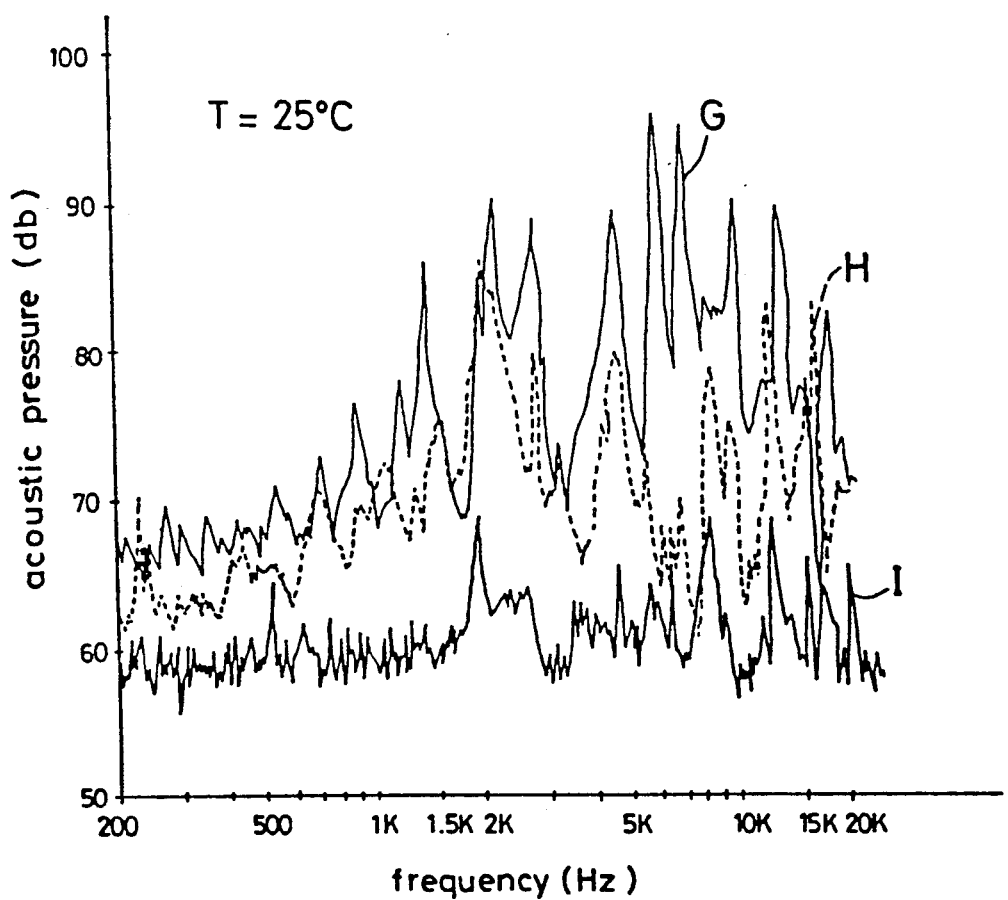

FIG. 4 shows the above-mentioned measurement results.

As is obvious from FIG. 4, it can be understood that the magnitude of the piezoelectric effect in the homogeneous alignment process (G) based on the strong rubbing method is greater than that in the homogeneous alignment process (H) based on the weak rubbing method.

As described above, the homogeneous alignment process by the strong rubbing method provides the large piezoelectric effect.

Measurement Example 4:

The measurement is performed by varying a voltage (Peak-to-Peak) impressed between the first electrode 1 and the second electrode 2. Note that the homogeneous alignment process (an alignment processing angle is set at 100°) is performed in all cases. A spacing at which the first and second electrodes 1 and 2 are disposed is 8 ($\mu$m).

J: An applied voltage is 30 (Vp-p)
K: An applied voltage is 10 (Vp-p)
L: An applied voltage is 0 (V)

Figure 5:
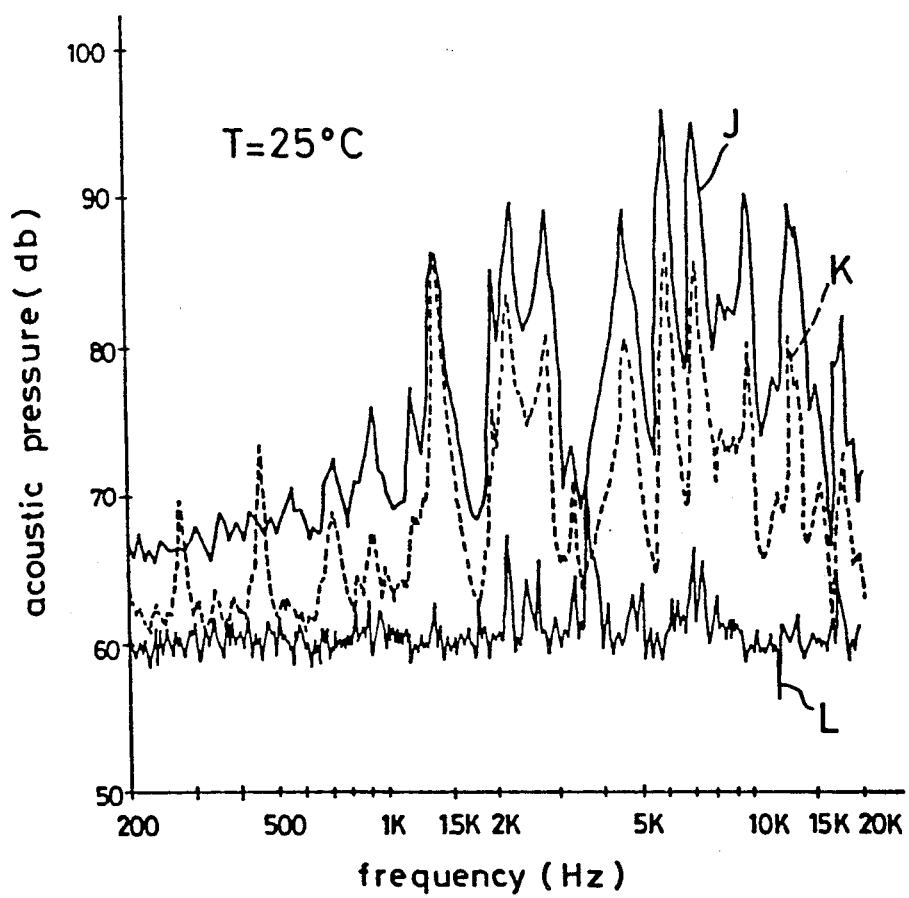

The above-mentioned measurement results are shown in FIG. 5.

It can be seen from FIG. 5 that the applied voltage increases with a greater piezoelectric effect.

Measurement Example 5

The measurement is carried out by varying the temperature in the following manner in the vicinity of a transition temperature (62° C. is adopted) at which the ferroelectric liquid crystal 3 transits from the ferroelectric phase to the smectic phase A. The homogeneous alignment process (an alignment processing angle is set at 100°) is executed in all cases. The first and second electrodes 1 and 2 are spaced 8 ($\mu$m) away from each other. It is to be noted that in this measurement mode the measurement is effected while holding the piezoelectric device on a hot plate in order to hold the piezoelectric device at a constant temperature. It may be said that the measurement is not performed in an ideal anechoic atmosphere. Hence, reflective components from the hot plate are included. Since temperatures on the hot plate may be defined as measurement temperatures, the accurate temperatures of the ferroelectric liquid crystal 3 are, it may be regarded, slightly different.

M: A temperature is 57 (°C.)
N: A temperature is 67 (°C.)

Figure 6:
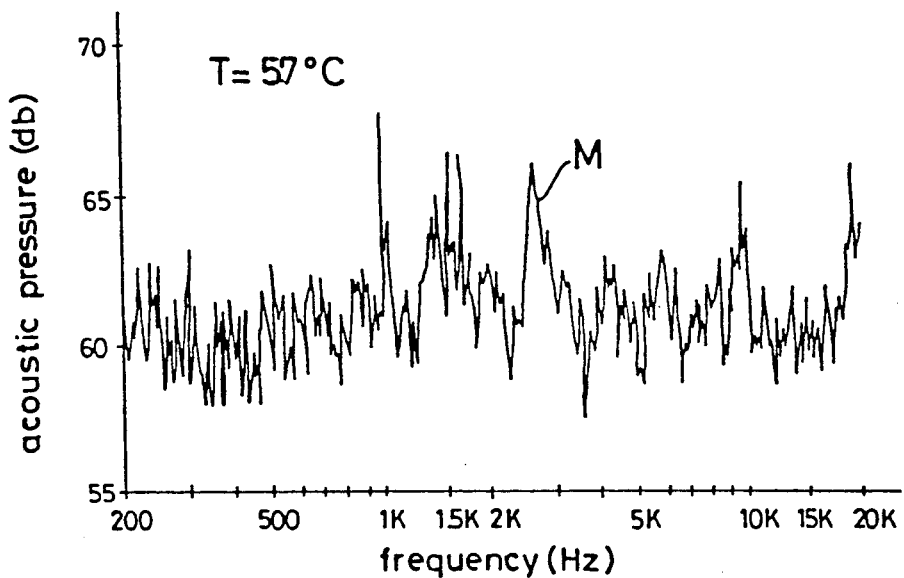
Figure 6:
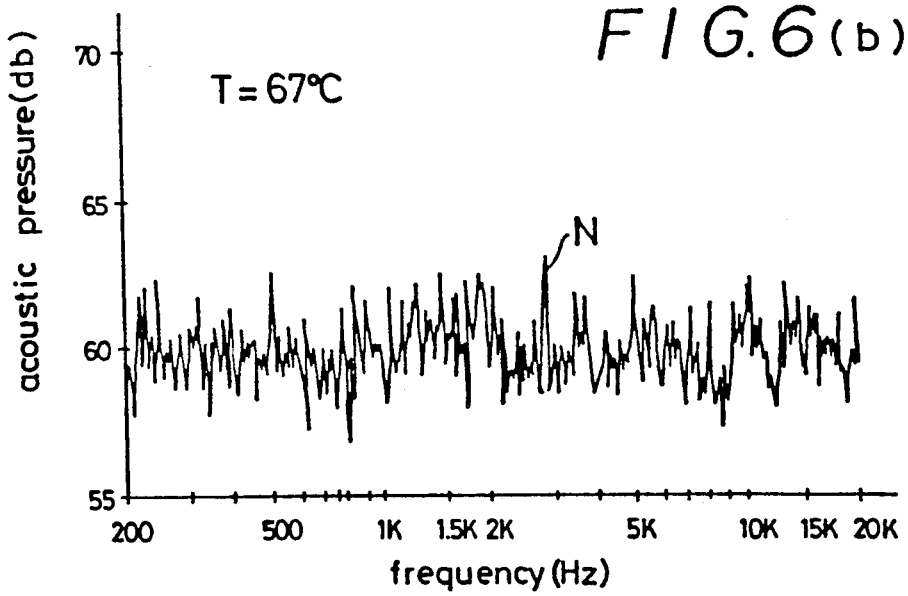

The measurement results are shown in FIGS. 6(a) and 6(b)

As can be clarified from FIGS. 6(a) and 6(b) the piezoelectric property is clearly exhibited in such a phase where the ferroelectric property is at a critical temperature or under is present. In a phase where the ferroelectric property is at the critical temperature or under is not present, no clear-cut piezoelectric property is developed.

For the reasons explained above, the effective piezoelectric property can be acquired in the phase (M) which exhibits the ferroelectric property.

Excepting the descriptions above, the piezoelectric device of the invention is capable of obtaining a favorable piezoelectric property in the following methods.

For the homogeneous alignment process, there may also be adopted an oblique vapor deposition method of silicon oxide or the like and a method which employs an L-B (Langmuir Blodgett) film of polyimide or the like other than the rubbing method.

It is preferable that the spacing between the first and second electrodes 1 and 2 be narrowed. The spacing at which the first and second electrodes 1 and 2 are disposed can be reduced down to as small as about 1 ($\mu$m). As the spacing becomes narrower, the electric field applied on the ferroelectric liquid crystal increases in intensity, thereby obtaining still greater piezoelectric property.

The alignment layer 4 formed between the first electrode 1 and the ferroelectric liquid crystal 3 and the alignment layer formed between the second electrode 2 and the ferroelectric liquid crystal 3 may be composed of materials different from each other. In this case, one alignment layer 4 is formed of a material which attracts spontaneous polarization of the ferroelectric liquid crystal, whereas the other alignment layer 4 is formed of a material which repulses the spontaneous polarization thereof. With this arrangement, respective molecules of the ferroelectric liquid crystal 3 are aligned with facility, and an effective piezoelectric property can thereby be acquired.

The ferroelectric liquid crystal 3 for use has preferably large spontaneous polarization. The inventors of the present invention made measurements with respect to the piezoelectric effects in a variety of ferroelectric liquid crystals 3. As a result, the inventors have confirmed that the piezoelectric device tends to produce a larger piezoelectric property, as the ferroelectric liquid crystal 3 for use has greater spontaneous polarization.

In a piezoelectric device using a ferroelectric substance, the poling process is effected in some cases to align the directions of the spontaneous polarizations whereas in the case of the piezoelectric device of the invention, the poling process may not be performed. The poling process is carried out preferably from a temperature of a nematic phase or an isotropic phase which falls within a range of temperatures higher that that of the smectic phase A rather that from a temperature at which the ferroelectric liquid crystal 3 is in the smectic phase A with a view to reducing the applied electric field in the poling process.

Excepting the above-mentioned polyimide and the like, the alignment layers 4 of ferroelectric substances such as PVDF and so forth may be employed. In this case, the poling process is preferably effected on the alignment layers 4 of the ferroelectric substances described above. However, if this poling process is carried out concurrently with the poling process of the ferroelectric liquid crystal 3, the steps of manufacturing the piezoelectric devices can be simplified.

For the reasons discussed above, preferably the following conditions or combinations of these conditions are needed for enhancing the piezoelectric property.

A large piezoelectric property can effectively be obtained under such conditions.

(1) The alignment layers 4 undergo a homogeneous alignment process.

(2) The alignment layers 4 undergo a homogeneous alignment process in parallel or with a deviation not in parallel with each other, (3) The alignment layers 4 are subjected to a homogeneous alignment process based on a strong rubbing method.

(4) The voltage impressed on the ferroelectric liquid crystal 3 is as high as the circumstances permit.

(5) The ferroelectric liquid crystal 3 is in a phase which exhibits the ferroelectric property.

(6) The spacing between the first and second electrodes 1 and 2 is as narrow as possible.

(7) One alignment layer 4 is formed of a material which attracts the spontaneous polarization of the ferroelectric liquid crystal 3, while the other alignment layer 4 is formed of a material which repulses the spontaneous polarization thereof.

(8) The ferroelectric liquid crystal 3 for use has large spontaneous polarization.

(9) The poling process is effected from a temperature at which the ferroelectric liquid crystal 3 is in the nematic phase or the isotropic phase. (II) Embodiments of the Piezoelectric Module The description will next deal with a piezoelectric module employing the piezoelectric device of the invention.

The piezoelectric module according to the present invention is fundamentally classified into two types.

Figure 7:
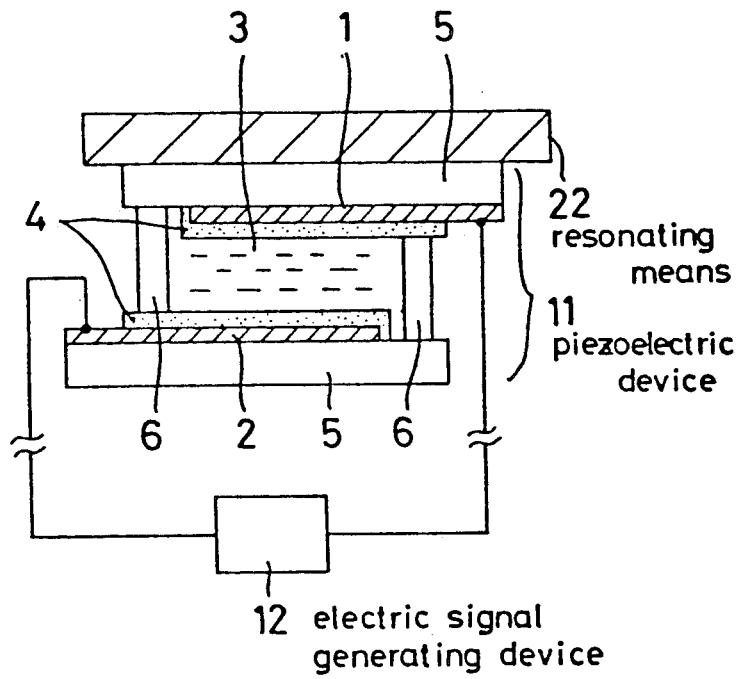
FIG. 7 is a sectional view of an electromechanical converting device according to the present invention.

(II-1): A piezoelectric module including the piezoelectric device 1 of the invention and an electric signal generating means 12 for supplying electric signals to the first and/or second electrode 1 and 2 of the piezoelectric device as shown in FIG. 7.

A sound emitting device, an actuator, a motor and so on can be constructed by use of the piezoelectric module.

There is herein given one example thereof, in which the first and/or second electrode 1 and 2 is composed of a transparent electrode of ITO or the like. In accordance with this construction, the piezoelectric device is used in common to a liquid crystal display element 3. With this arrangement, the sound emitting device and the display device can be composed of the same elements, or the piezoelectric device may be laminated on a poster or a display device, thus providing a compact unit.

Figure 8:
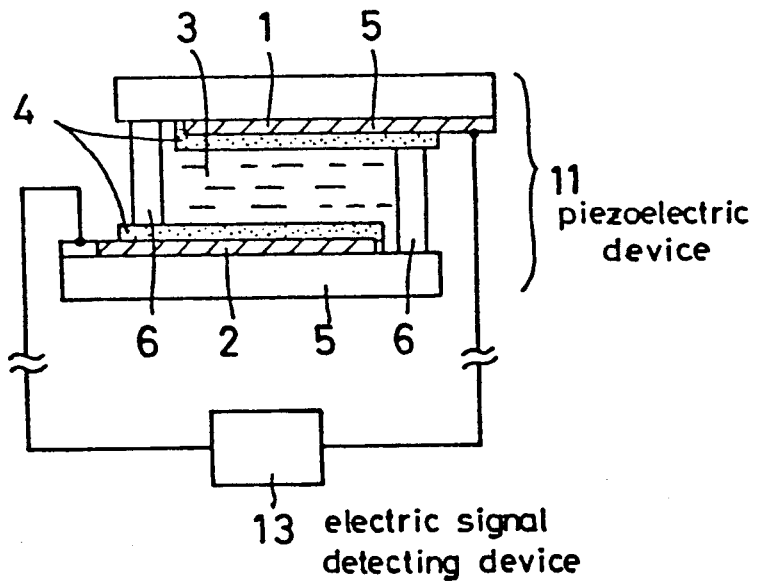
FIG. 8 is a sectional view of a mechanoelectric converting device according to the present invention.

(II-2): A piezoelectric module including the piezoelectric device 1 of the invention and an electric signal detecting means 13 for detecting the electric signals of the first and/or second electrode 1 and 2 of the piezoelectric device as shown in FIG. 8.

A piezoelectric sensor, which will be mentioned later, can be constructed by using this piezoelectric module.

In the piezoelectric modules described in (II-1) and (II-2), the piezoelectric devices can easily be manufactured in arbitrary configurations with a high dimensional accuracy. Besides, each of these piezoelectric modules is excellent in terms of mechanical strength, and is therefore capable of producing large effects. (III) Embodiments of an Electromechanical Converting Device:

Referring to FIG. 7, there is illustrated an electromechanical converting device according to the present invention.

The electromechanical converting device includes a piezoelectric device 11 serving as an electromechanical converting means in the present invention, and an electric signal generating means 12 for supplying electric signals to the first and/or second electrode of the piezoelectric device 11.

In the electromechanical converting device of the invention, the piezoelectric devices can readily be manufactured in arbitrary configurations with a high accuracy in dimension, and are also superior in mechanical strength. An electromechanical converting device which yields great effects can be obtained.

Specific examples of utilization of the electromechanical converting device will be described below.

III-1 UTILIZING EXAMPLE 1

In this utilizing example, the foregoing electromechanical converting device is arranged to be a an electroacoustic converting device.

Where the piezoelectric device of the invention is solely employed as an electroacoustic converting means of a sound emitting body, sufficient acoustic outputs can not be acquired in some cases depending on the applications. In this case, a resonating means 22 corresponding to natural oscillations of the piezoelectric device may, as depicted in FIG. 7, be incorporated.

The resonating means may involve the use of an oscillatory plate of foaming phlystyrol or a foaming aluminum plate, or a Helmholtz's resonant box. In this case, the natural oscillations of the piezoelectric device are made to correspond to those of the resonating means, and they are brought into a resonant state. Consequently, great acoustic outputs can be obtained.

III-1 UTILIZING EXAMPLE 2

In this utilizing example, the foregoing electromechanical converting device is provided with a power converting means for converting piezoelectric oscillations of the piezoelectric device of the invention into rotary motions.

A piezoelectric motor will hereinafter be exemplified.

The piezoelectric motor for converting vertical oscillations of the piezoelectric device into circular motions is fundamentally classified into two types. The piezoelectric motors of these two types can be constructed even by employing the piezoelectric device according to the present invention. These piezoelectric motors also, as a matter of course, exhibit basic effects of the electromechanical converting device which has already been stated above.

Concrete examples will hereinafter be given in conjunction with the drawings.

Figure 9:
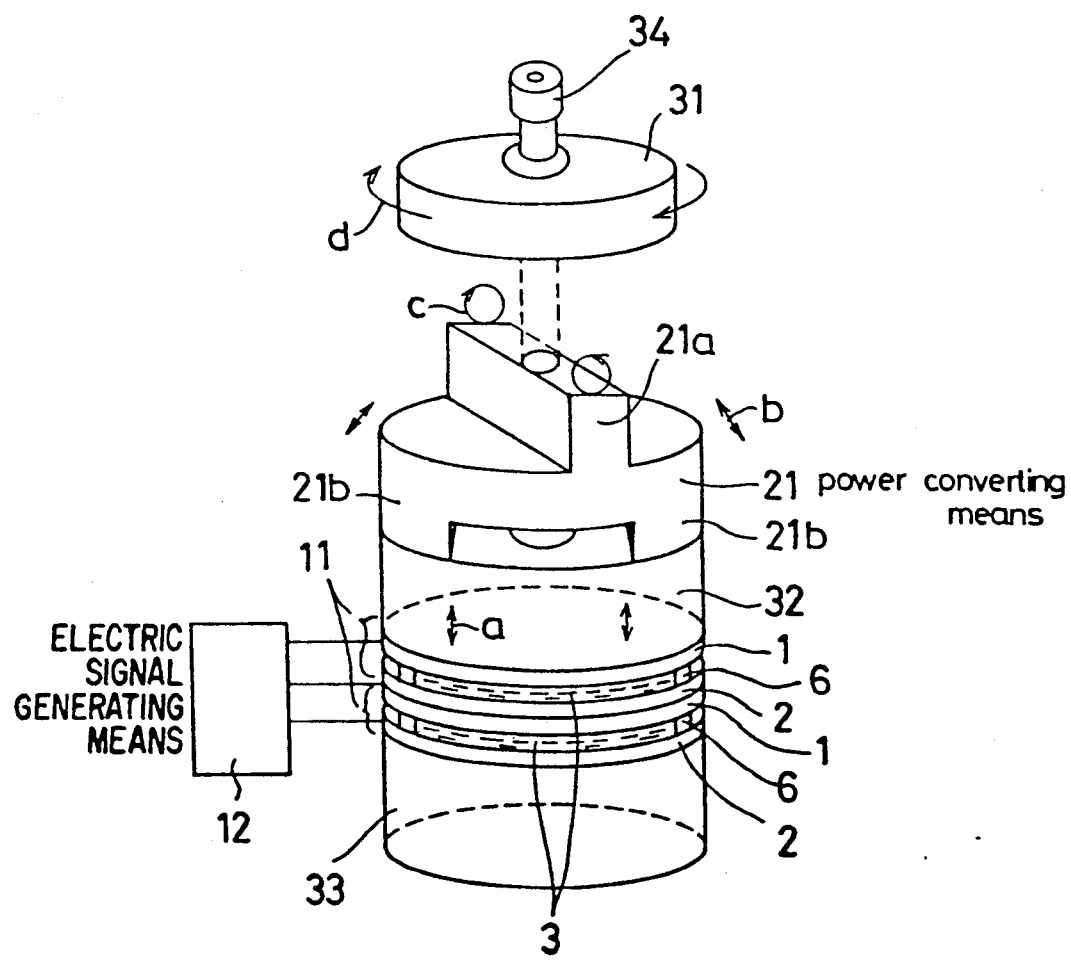
FIG. 9 is a perspective view of a piezoelectric motor as one example of a mechanoelectric converting device according to the present invention.

FIG. 9 illustrates one example of the piezoelectric motor of the first mode. (See pp.115~116, Nikkei Electronics issued on Sep. 23, 1985)

Referring again to FIG. 9, the numeral 11 designates a piezoelectric device of the invention which serves as an electromechanical converting means. Two piezoelectric devices 11 are provided in this example. The first electrode 1 of one piezoelectric device 11 is adhered closely to the second electrode 2 of the other piezoelectric device 1. Designated at 12 is an electric signal generating means for supplying the electric signals to the individual electrodes of the piezoelectric devices 11. In this example, two kinds of AC signals, which are out of phase with each other, are generated to equalize the oscillatory directions of the two piezoelectric devices 11, and the signals are transmitted to the two piezoelectric devices 11, respectively. Indicated at 21 is a power converting means for converting the piezoelectric oscillations of the piezoelectric devices into rotary motions. The numeral 31 denotes a rotor which makes revolutions; 32 and 33 upper and lower disks; and 34 a bolt for fixing the center of the power converting means 21.

Upon receiving the AC signals transmitted from the electric signal generating means 12, vertical oscillations (a) are caused in the two piezoelectric devices 11, these oscillations being then propagated to the power converting means 21. At this time, the forces act on the two lengths of legs 21b of the power converting means 21. As the center of the power converting means 21 is fixed by the bolt 34, the power converting means 21 makes bending motions in the direction of arrow b. In this example, protrusions 21a of the power converting means 21 are inclined to the legs 21b, whereby the protrusions 21a make twisting in the direction of arrow C. During the twisting oscillations, the rotor 31 is forced to rotate by utilizing a period for which displacement of the protrusions 21a takes place in parallel with a face of the rotor 31.

In this example, the forces are exerted on the piezoelectric devices 11 when fastening the bolt 34, so that the piezoelectric devices 11 are never broken. The bolt 34 can be fastened tightly, thereby making it possible to perform stable operations.

The description will next be focused on the second mode of the piezoelectric motor.

Figure 10:
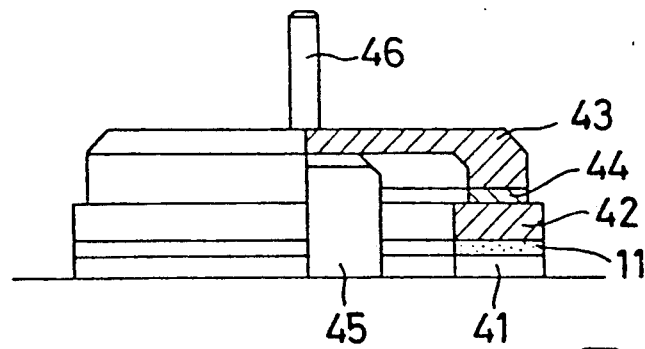
FIG. 10 is a partial sectional view of a prior art piezoelectric motor.
Figure 11:
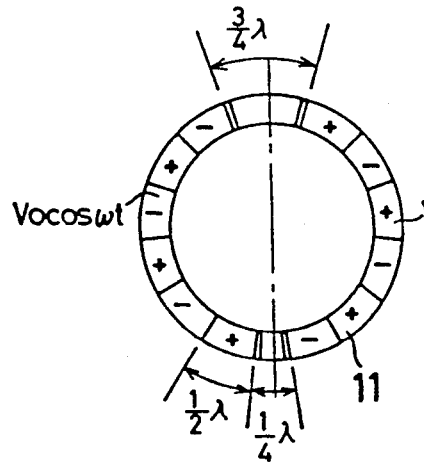
FIG. 11 is a plan view of an electrode arrangement of a prior art piezoelectric motor.

FIGS. 10 and 11 each illustrate one example of the conventional piezoelectric motor based on the second mode.

In the Figures, the numeral 11 denotes a piezoelectric device using ceramic materials; 41 a lower electrode; 42 an upper electrode; 43 a rotor; 44 a slider; 45 a bearing; and 46 a shaft.

The arrangement is such that as depicted in FIG. 11, there are provided two trains of the piezoelectric devices 11 polarized in opposite directions and connected at every ¼ wavelength (λ/2), and adjacent mutual ends of the piezoelectric device trains are spaced at λ/4 and 3λ/4 from each other to provide a circular configuration on the whole. AC voltages, which are out of phase by 90 degrees, are impressed on the two piezoelectric device trains, and surface travelling waves are produced. The travelling waves are imparted to the rotor 43, thereby causing rotary motions of the rotor 43.

If the conventional piezoelectric devices of the piezoelectric motor are replaced with the piezoelectric devices of the invention, unlike the prior art it is unnecessary to singly paste the respective piezoelectric devices which constitute the piezoelectric device trains. All the piezoelectric device trains are simultaneously formed simply by injecting the ferroelectric liquid crystal 3 in between the electrodes on which patterning has been effected. Besides, there is no necessity for adjusting respective heights thereof. There is also no possibility of the piezoelectric devices being broken. Thus, a piezoelectric motor, which has excellent mechanical strength, can be attained.

Where the piezoelectric devices of the invention are used for the above-mentioned piezoelectric motor, the following operations are effective in obtaining polarizations directed opposite to each other. More specifically, in the direction of one polarization, materials acting to attract and repulse the spontaneous polarization of the ferroelectric liquid crystal 3 are employed for the alignment layers 4 corresponding to the first and second electrodes 1 and 2, whereas in the direction of the other polarization, materials acting to repulse and attract the spontaneous polarization of the ferroelectric liquid crystal 3 are used for the alignment layers 4 corresponding to the first and second electrodes 1 and 2 of the piezoelectric device 11. In this case, preferably the alignment processes are not effected for every alignment layer 4 but effected concurrently.

Figure 12:
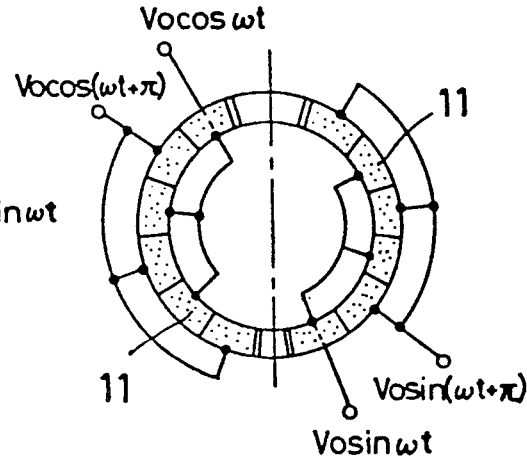
FIG. 12 is a plan view of an electrode arrangement of a piezoelectric motor according to the present invention.

The piezoelectric devices 11 polarized in directions opposite to each other are not necessarily disposed at every ½ wavelength (λ/2). For instance, as illustrated in FIG. 12, the polarizing directions of the respective piezoelectric devices 11 are the same, and AC voltages which are out of phase by 180 degrees may be applied to the adjacent piezoelectric devices 1.

Figure 13:
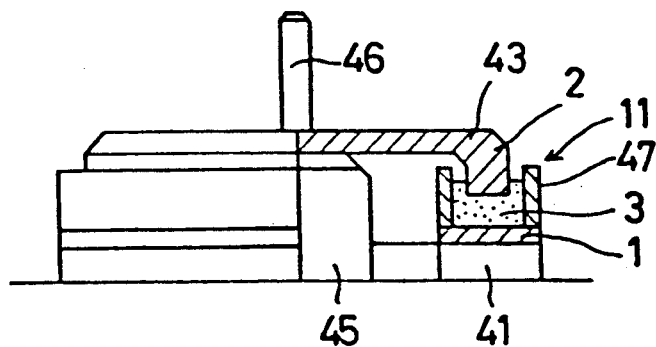
FIG. 13 is a partial sectional view of a piezoelectric motor according to another embodiment of the present invention.

When using the piezoelectric devices according to the present invention, excepting the foregoing piezoelectric motor, a piezoelectric motor depicted in FIG. 13 can be constructed.

Referring to FIG. 13, a piezoelectric device generally indicated at 11 is composed of a first electrode 1 of the piezoelectric device, a second electrode 2 serving as an upper electrode shaped integrally with the rotor 43, and a ferroelectric liquid crystal 3. The numeral 41 represents a lower electrode; 45 a bearing; 46 a shaft; and 47 a retaining wall for retaining the ferroelectric liquid crystal 3. Turning to FIG. 12, there are shown a construction of the first electrode 1 an AC voltage impressed on the first electrode 1 and the connection thereof.

In this example, the piezoelectric devices 1 are not broken at all, and a piezoelectric motor having excellent mechanical strength can be acquired. Moreover, a plurality of piezoelectric devices 11 can be manufactured simultaneously. The rotor 43 is disposed afloat above the ferroelectric liquid crystal 3, as a result of which the rotor 43 and the piezoelectric devices 11 are never abraded. A highly reliable piezoelectric motor can be obtained.

(IV) Emobodiments of a Mechanoelectric Converting Device

FIG. 8 depicts a mechanoelectric converting device according to the present invention.

The mechanoelectric converting device is devised under such circumstances that the present inventors have found out that electromotive forces were created between the two electrodes 1 and 2 when exerting mechanical forces on the piezoelectric devices of the invention.

The mechanoelectric converting device includes a piezoelectric device 11 of the invention which serves as a mechanoelectric converting means, and an electric signal detecting means 13 for detecting the electric signals transmitted from the first and/or second electrode 1 and 2 of the piezoelectric device 11.

In the mechanoelectric converting device according to the present invention, the piezoelectric devices can easily be manufactured in arbitrary configurations with a high dimensional accuracy and with a superior mechanical strength. A mechañoelectric converting device which yields great effects can thus be attained.

A piezoelectric sensor will be given as one example of the mechanoelectric converting device.

The piezoelectric sensor functions to read pressures converted into electric signals and exerted on the piezoelectric devices 11 by detecting these electric signals with the electric signal detecting means 13.

The piezoelectric devices of the invention are excellent in terms of mechanical strength, thereby obtaining a piezoelectric sensor which is never damaged even when receiving a large pressure. A plurality of electrodes are subjected to patterning by an etching method or other similar methods, and it is therefore possible to produce a plurality of sensors concurrently and uniformly.

The piezoelectric device 1 according to the present invention primarily includes the ferroelectric liquid crystal 3 which is variable in configuration, whereby the piezoelectric device 1 can be formed in arbitrary shapes. The manufacture thereof does not fundamentally require processes at high temperatures exceeding several-hundred degrees, and therefore the piezoelectric device 1 can be formed with a high accuracy in dimension. Besides, a poling process for developing the piezoelectric property is not needed. It is also possible to obtain a piezoelectric device which has superior mechanical strength and to simultaneously uniformly manufacture a plurality of piezoelectric devices.

The piezoelectric devices of the invention exhibit high piezoelectric properties in the following modes or by combinations thereof.

(1) The alignment layers 4 undergo a homogeneous alignment process.

(2) The alignment layers 4 undergo a homogeneous alignment process in parallel or with a deviation not in parallel with each other (3) One alignment layer 4 is formed of the material which attracts spontaneous polarization of the ferroelectric liquid crystal 3, whereas the other alignment layer 4 is formed of material which repulses spontaneous polarization thereof.

(4) The alignment layers 4 are subjected to a homogeneous alignment process by a the strong rubbing method.

In a piezoelectric module, electromechanical converting device and mechanoelectric converting device according to the present invention, great effects are exhibited because the piezoelectric devices can be manufactured in arbitrary configurations with high dimensional accuracy.

Especially in the case of adding a power converting means to the electromechanical converting device, there are produced effects other than the foregoing effects, wherein the piezoelectric devices are never broken, and excellent mechanical strength is provided.

What is claimed is:

1. An electromechanical converting device for converting electric energy into mechanical energy, comprising a ferroelectric liquid crystal panel having a first electrode; a second electrode disposed in opposing relation to said first electrode; a ferroelectric liquid crystal interposed between said first and second electrodes; and a first alignment layer formed between said ferroelectric liquid crystal and said first electrode; electric signal generating means connected to apply electric signals between said first and second electrodes; whereby said ferroelectric crystal panel oscillates in response to said electric signals, and movable means mounted to be moved in correspondence with said oscillation of said ferroelectric liquid crystal panel.

2. The electromechanical converting device of claim 1 further comprising a second alignment layer between said second electrode and said ferroelectric liquid crystal.

3. The electromechanical converting device of claim 2 wherein said first alignment layer and said second alignment layer have homogeneous alignments that are neither parallel nor anti-parallel with respect to one another.

4. The electromechanical converting device of claim 2 wherein said first alignment layer and said second alignment layer are comprised of different materials.

5. The electromechanical converting device of claim 2 wherein said first alignment layer attracts spontaneous polarization of said ferroelectric liquid crystal, and said second alignment layer repulses spontaneous polarization of said ferroelectric liquid crystal.

6. The electromechanical converting device of claim 1 wherein said alignment layer has homogeneous alignment resulting from strong rubbing.

* * * * *